US012648342B2

(12) United States Patent
Lee et al.

(10) Patent No.: US 12,648,342 B2
(45) Date of Patent: Jun. 2, 2026

(54) DISPLAY APPARATUS

(71) Applicant: LG Display Co., Ltd., Seoul (KR)

(72) Inventors: Yong-Ku Lee, Paju-si (KR); Sung-Woo Kim, Paju-si (KR); Young-Bok Lee, Paju-si (KR); Chi-Yong Kim, Paju-si (KR); A-Ra Yoon, Paju-si (KR); Se-Wan Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 378 days.

(21) Appl. No.: 18/355,356

(22) Filed: Jul. 19, 2023

(65) Prior Publication Data

US 2024/0268198 A1    Aug. 8, 2024

(30) Foreign Application Priority Data

Feb. 3, 2023    (KR) ........................ 10-2023-0014711

(51) Int. Cl.
*H10K 59/80*        (2023.01)
*G02F 1/1335*       (2006.01)
*H10K 59/121*       (2023.01)

(52) U.S. Cl.
CPC ..... *H10K 59/879* (2023.02); *G02F 1/133512* (2013.01); *G02F 1/133526* (2013.01); *H10K 59/1213* (2023.02); *H10K 59/873* (2023.02); *H10K 59/8792* (2023.02)

(58) Field of Classification Search
CPC ............... H10K 59/879; H10K 59/873; H10K 59/8792; H10H 29/842; H10H 29/852; H10H 29/855; H10H 29/8552
See application file for complete search history.

(56) References Cited

U.S. PATENT DOCUMENTS

| | | | |
|---|---|---|---|
| 5,953,148 | A | 9/1999 | Moseley et al. |
| 2011/0018860 | A1 | 1/2011 | Parry-Jones et al. |
| 2012/0113100 | A1 | 5/2012 | Niioka et al. |
| 2012/0176378 | A1 | 7/2012 | Mather et al. |
| 2014/0292732 | A1 | 10/2014 | Niioka et al. |
| 2020/0357854 | A1 | 11/2020 | Koshihara |
| 2021/0014393 | A1 | 1/2021 | Hinata et al. |
| 2022/0099985 | A1 * | 3/2022 | Li ...................... G02B 27/0922 |
| 2022/0238845 | A1 | 7/2022 | Sano et al. |

(Continued)

FOREIGN PATENT DOCUMENTS

| | | | | |
|---|---|---|---|---|
| CN | 115472730 | A  * | 12/2022 | ........... H10H 20/856 |
| EP | 4092454 | A1  * | 11/2022 | ............. H10K 71/00 |
| JP | 2020-184478 | A | 11/2020 | |

(Continued)

OTHER PUBLICATIONS

Korean Intellectual Property Office, Office Action, Korean Patent Application No. 10-2023-0014711, Jul. 18, 2025, 14 pages.

(Continued)

*Primary Examiner* — Mariceli Santiago
(74) *Attorney, Agent, or Firm* — Fenwick & West LLP

(57)    ABSTRACT

A display apparatus according to the disclosure comprises a substrate including first region and eh second region, a display device for display an image in the first region, and a lens above the display device in the first region, wherein a center of the display device and a center of the lens are spaced apart from each other by a predetermined distance.

19 Claims, 7 Drawing Sheets

(56) References Cited

U.S. PATENT DOCUMENTS

2022/0367838 A1    11/2022  Wang et al.

FOREIGN PATENT DOCUMENTS

KR      10-2022-0108714 A      8/2022
WO      WO-2022220053 A1 *  10/2022  ........... G02B 27/026

OTHER PUBLICATIONS

Intellectual Property Office of the United Kingdom, Combined Search and Examination Report, United Kingdom Patent Application No. GB2316574.9, Apr. 12, 2024, 10 pages.
Intellectual Property Office of the United Kingdom, Examination Report, United Kingdom Patent Application No. GB2316574.9, Oct. 21, 2025, eight pages.

* cited by examiner

DISPLAY APPARATUS

CROSS-REFERENCE TO RELATED APPLICATIONS

This application claims priority to and the benefit of Republic of Korea Patent Application No. 10-2023-0014711, filed on Feb. 3, 2023, the disclosure of which is incorporated herein by reference in its entirety.

BACKGROUND

1. Technical Field

The disclosure relates to a display apparatus capable of improving luminance according to a viewing angle.

2. Discussion of the Related Art

A flat panel display apparatus (FPD) is widely used in various electronic devices such as portable computers such as notebook computer, PDA, and mobile phone terminal as well as desktop computer monitors due to advantages in miniaturization and light weight. This flat panel display apparatus includes a liquid crystal display apparatus, an organic light emitting display apparatus, a quantum dot display apparatus, and the like.

The flat panel display apparatus is generally used for TV and computer monitor, but recently it is also widely used for portable display apparatus and user interfaces of other electronic devices. In particular, as IT technology develops, it is widely used as a dashboard for automobiles.

In the conventional dashboard of the vehicle, various information such as the speed of the vehicle, the amount of the fuel, and rpm information of the vehicle, are displayed in the analog display window. However, in recently, the flat panel display apparatus is installed in the vehicle to display various types of information about the vehicle.

In the dashboard of the vehicle, unlike the computer or the portable terminal, the viewing direction of the user is fixed at the region above the horizontal. However, the luminance at the region above the horizontal is lowered in the prior display apparatus.

SUMMARY

An object of the disclosure is to provide a display apparatus capable of improving luminance in a corresponding main viewing direction when the main viewing direction is not a front viewing angle, such as in a dashboard of a vehicle.

The display apparatus according to the disclosure comprises a substrate including first region and a second region, a display device for displaying an image in the first region, and a lens above the display device in the first region, wherein a center of the display device and a center of the lens are spaced apart from each other by a predetermined distance.

A light shielding layer may be formed in the second region and a passivation layer may be formed over the lens and the light shielding layer.

The lens includes a convex lens and the lens is made of at least one material selected from a group consisting of acrylic resin, polyimide, polyamide, polycarbonate, polystyrene, and polyethylene terephthalate.

The distanced between the center of the display device and the center of the lens may be determined by an emission angle of a desired area from the center of the lens, a magnification of the lens, a distance between the display device and the lens, an incident angle of the center of the lens from the center of the display device.

The display device may be formed in an asymmetrical shape in which the light output area is different according to the region. The display device may be formed in a trapezoid shape. The trapezoid shape includes a first side, a second side longer than the first side, and a third side between the first side and the second side, and the second side is dependent on the lengths of the first side and the third side, a distance between the display device and the lens, a magnification of the lens, and an incident angle of the center of the lens from the center of the display device.

In one embodiment, a display apparatus includes a plurality of sub-pixels on the substrate. A sub-pixel may include a light emitting device for displaying light and a transistor for driving the light emitting device. The display apparatus includes a plurality of convex lens on the plurality of sub-pixels. In one embodiment, a convex lens is disposed such that the convex lens overlaps at least a portion of the light emitting device in a first direction, and at least a portion of the displayed light is emitted toward first direction. A center of the convex lens in a second direction intersecting the first direction may be offset from a center of the light emitting device in the second direction.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
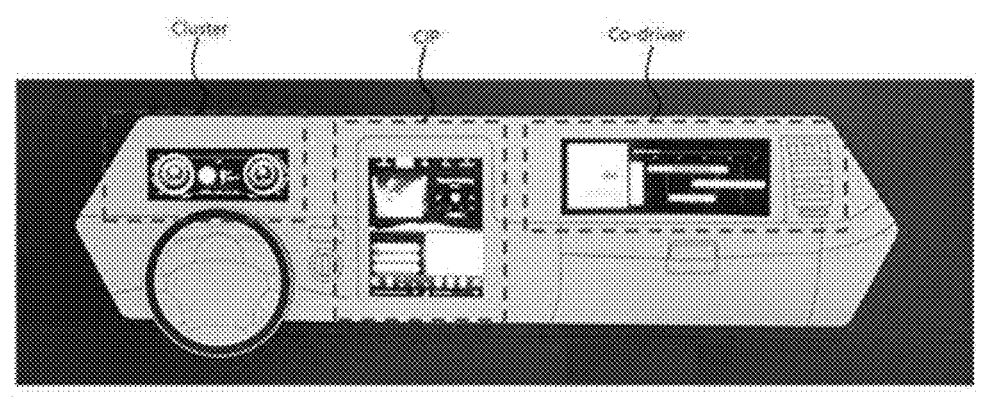
FIG. 1 is a view showing a dashboard of a vehicle according to an embodiment of the disclosure.

Advantages and features of the disclosure and methods for achieving them will be made clear from embodiments described in detail below with reference to the accompanying drawings. The present disclosure may, however, be implemented in many different forms and should not be construed as being limited to the embodiments set forth herein, and the embodiments are provided such that the disclosure will be thorough and complete and will fully convey the scope of the present disclosure to those skilled in the art to which the present disclosure pertains, and the present disclosure is defined only by the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout the disclosure. Further, in the following description of the present disclosure, when a detailed description of a known related art is determined to unnecessarily obscure the gist of the present disclosure, the detailed description thereof will be omitted herein. When terms such as "including," "having," "consisting of," and the like mentioned in the disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts may be located between the two parts.

In describing a temporal relationship, for example, when a temporal predecessor relationship is described as being "after," "subsequent," "next to," "prior to," or the like, unless "immediately" or "directly" is not used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing the components of the present specification, terms such as first, second, A, B, (a), (b), etc. may be used. These terms are only for distinguishing the elements from other elements, and the essence, order, or number of the elements are not limited by the terms. When it is described that a component is "connected" "coupled" or "connected" to another component, the component may be directly connected or connected to the other component, but indirectly without specifically stated It should be understood that other components may be "interposed" between each component that is connected or can be connected.

As used herein, the term "apparatus" may include a display apparatus such as a liquid crystal module (LCM) including a display panel and a driving unit for driving the display panel, and an organic light emitting display module (OLED module). Further, the term "apparatus" may further include a notebook computer, a television, a computer monitor, a vehicle electric apparatus including an apparatus for a vehicle or other type of vehicle, and a set electronic apparatus or a set apparatus such as a mobile electronic apparatus of a smart phone or an electronic pad, etc., which are a finished product (complete product or final product) including LCM and OLED module.

Accordingly, the apparatus in the present specification may include the display apparatus itself such as the LCM, the OLED module, etc., and the application product including the LCM, the OLED module, or the like, or the set apparatus, which is the apparatus for end users.

Hereinafter, the disclosure will be described in detail with reference to the accompanying drawings.

FIG. 1 is a view showing the dashboard of the vehicle according to an embodiment of the disclosure.

Initially, the dashboard of the vehicle displayed only the simple information including the number such as the speed and the RPM of the vehicle and the warning light. However, recently, as information is digitized and new vehicles such as smart cars, connected cars, and autonomous cars are introduced, various vehicle information should be display in the dashboard. For example, the recent dashboard should display various operations and situations of the vehicle, such as the distance to the vehicle in front, pedestrian recognition, vehicle approach warning, cruise driving information, lane keeping assist function, and autonomous driving.

Further, as the amount of time spent in the vehicle increases, the vehicle is not just a transporting means, but are becoming tools of entertainment that provide a variety of things to see and hear. For example, not only the vehicle information is provided to the driver, but also the entertainment such as movies, music, and games are provided to the passengers.

The dashboard for providing such various information is gradually developing into an analog dashboard using gauges and, a hybrid dashboard in which a small display apparatus is inserted into the analog dashboard, and a digital cluster in which the entire dashboard is applied as a digital display apparatus.

The analog dashboard is difficult to modify or change because all numbers, scales, needles, etc. are made of real objects, whereas the digital dashboard has a great advantage in that the dashboard screen can be changed in various ways according to the driver and vehicle conditions or driving mode.

As shown in FIG. 1, the dashboard of the disclosure is made of the display apparatus and the display apparatus is formed in a gauge cluster and a center fascia.

The display apparatus includes a cluster, a CID (Center Information Display), and a co-driver display to provide the various information to the driver and all passengers in the automobile. The cluster is disposed in front of a driver to provide information, such as the automobile operation information of the automobile speed and automobile RPM, various warning lights, automobile approach warning, cruise driving information, lane maintenance assistance function, autonomous driving, etc., to the driver. The CID is disposed in the center of the front of the automobile to display the automobile information such as temperature inside and outside of the automobile and a navigation information and to combine the mobile phone to the system of the automobile. The co-driver display provides the services such as video, sound, and games to passengers.

Although the cluster, the CID, and the co-driver display is formed as one display apparatus in figure, the display apparatus for the cluster, the CID, and the co-driver can be separately formed in the gauge cluster and the center fascia.

Further, only the cluster and the co-driver display are formed as one display apparatus and the CIP is separately formed in the center fascia. In this case, the cluster and the co-driver display are provided by the display apparatus manufacturer, and the CIP that displays vehicle information and connects to external devices such as mobile or audio is installed by the vehicle manufacturer. Thus, various types of the dashboard may be produced to highlight the personality of vehicle companies.

Various display apparatus may be applied to the disclosure. For example, the flat panel such as a liquid crystal display apparatus or an organic light emitting display apparatus may be applied as the display apparatus 1 of the disclosure.

Since the display apparatus 1 of the disclosure is installed in the gauge cluster and the center fascia of the automobile, the display apparatus may be formed in the various shapes according to the kind of the automobile. For example, the display apparatus may be formed in a curved shape depending upon the shapes of the gauge cluster and the center fascia. In order to manufacture the display apparatus of the various shapes, the display apparatus 100 should be formed in the flexible display apparatus or curved display apparatus.

Further, the display apparatus of the automobile should not only provide simple information such as automobile information or driving information, but must provide service images such as movies or games to the passenger through the co-driver display apparatus. Therefore, the display apparatus has to display the high quality images.

In addition, since the power is supplied to the display apparatus from a battery of the automobile, it is necessary to minimize power consumption to minimize the burden on the battery.

In view of this point, an organic light emitting display apparatus is suitable as the display apparatus of the disclosure. The organic light emitting display apparatus can be easily manufactured as the flexible and curved display apparatus. Further, the organic light emitting display apparatus has better image quality than other flat panel display apparatus such as the liquid crystal display apparatus. In addition, the organic light emitting display apparatus can reduce power consumption compared to the liquid crystal display apparatus. Therefore, the organic light emitting display apparatus is suitable as the dashboard of the vehicle.

Figure 2:
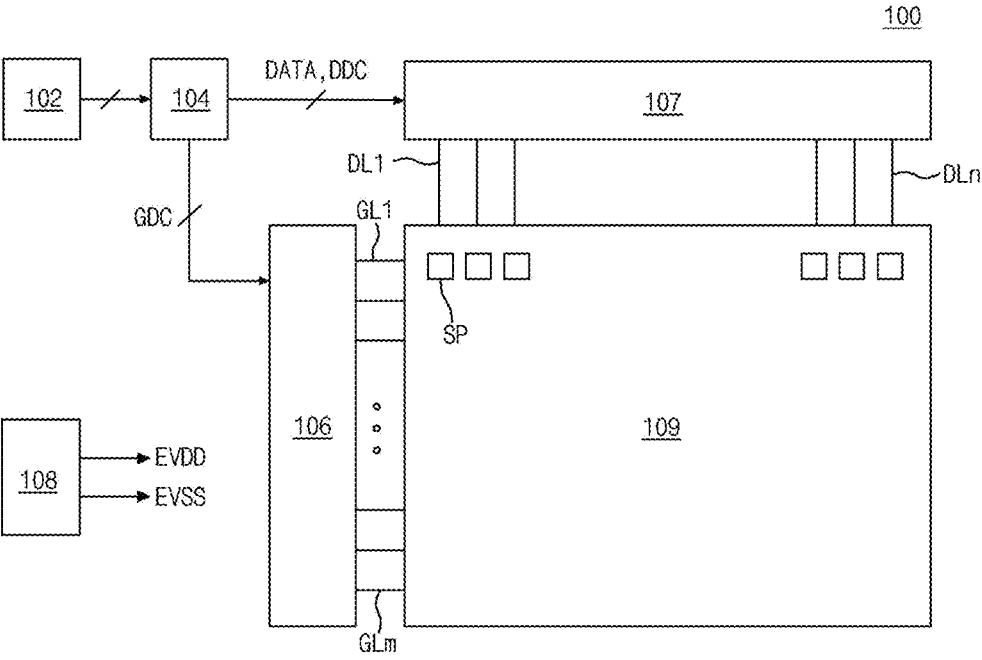
FIG. 2 is a schematic block diagram of a display apparatus according to an embodiment of the disclosure.
Figure 3:
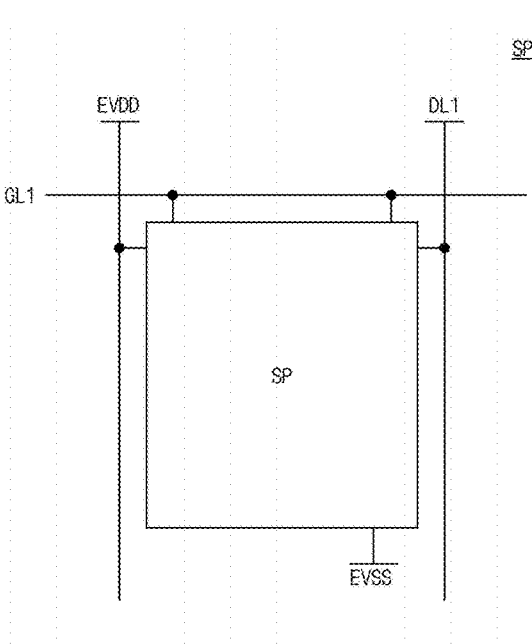
FIG. 3 is the schematic block diagram of a sub-pixel shown in FIG. 2 according to an embodiment of the disclosure.

FIG. 2 is the schematic block diagram and FIG. 3 is the schematic block diagram of the sub-pixel of the organic light emitting display apparatus according to an embodiment of the disclosure.

As shown in FIG. 2, the organic light emitting display apparatus 100 includes an image processing unit 102, a timing controlling unit 104, a gate driving unit 106, a data driving unit 107, a power supplying unit 108, and a display panel 109.

The image processing unit 102 outputs an image data supplied from outside and a driving signal for driving various devices. For example, the driving signal from the image processing unit 102 can include a data enable signal, a vertical synchronizing signal, a horizontal synchronizing signal, and a clock signal.

The image data and the driving signal are supplied to the timing controlling unit 104 from the image processing unit 102. The timing controlling unit 104 writes and outputs gate timing controlling signal GDC for controlling the driving timing of the gate driving unit 106 and data timing controlling signal DDC for controlling the driving timing of the data driving unit 107 based on the driving signal from the image processing unit 102.

The gate driving unit 106 outputs the scan signal to the display panel 109 in response to the gate timing control signal GDC supplied from the timing controlling unit 104. The gate driving unit 106 outputs the scan signal through a plurality of gate lines GL1 to GLm. In this case, the gate driving unit 106 may be formed in the form of an integrated circuit (IC), but is not limited thereto. The gate driver 106 includes various gate driving circuits, and the gate driving circuits may be directly formed on the substrate 110. In this case, the gate driver 106 may be a gate-in-panel (GIP).

The data driver 107 outputs the data voltage to the display panel 109 in response to the data timing control signal DDC input from the timing controlling unit 104. The data driving unit 107 samples and latches the digital data signal DATA supplied from the timing controlling unit 104 to convert it into the analog data voltage based on the gamma voltage. The data driving unit 107 outputs the data voltage through the plurality of data lines DL1 to DLn. In this case, the data driving 107 may be mounted on the upper surface of the display panel 109 in the form of an integrated circuit (IC), but is limited thereto.

The power supplying unit 108 outputs a high potential voltage VDD and a low potential voltage VSS etc. to supply these to the display panel 109. The high potential voltage VDD is supplied to the display panel 109 through the first power line EVDD and the low potential voltage VSS is supplied to the display panel 109 through the second power line EVSS. In this time, the voltage from the power supplying unit 108 are applied to the data driving unit 107 or the gate driving unit 106 to drive thereto.

The display panel 109 displays the image based on the data voltage from the data driving unit 108, the scan signal from the gage driving unit 106, and the power from the power supplying unit 108.

The display panel PAN includes a plurality of sub-pixels SP to display the image. The sub-pixel SP can include Red sub-pixel, Green sub-pixel, and Blue sub-pixel. Further, the sub-pixel SP can include White sub-pixel, the Red sub-pixel, the Green sub-pixel, and the Blue sub-pixel. The White sub-pixel, the Red sub-pixel, the Green sub-pixel, and the Blue sub-pixel may be formed in the same area or may be formed in different areas.

As shown in FIG. 2, one sub-pixel SP may be connected to the gate line GL1, the data line DL1, the first power line EVDD, and the second power line EVSS. The driving method and the number of transistors and capacitors of the sub-pixel SP is determined according to the configuration of the pixel circuit.

Figure 4:
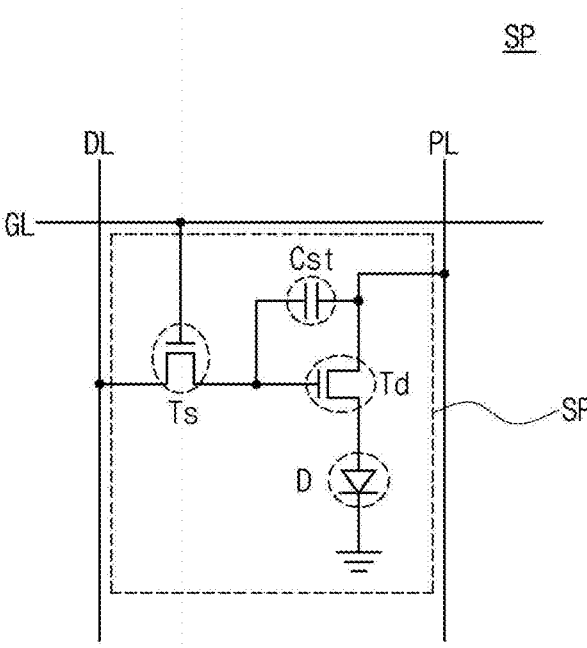
FIG. 4 is a circuit diagram conceptually showing sub-pixels of an organic light emitting display apparatus according to an embodiment of the disclosure.

FIG. 4 is the circuit diagram illustrating the sub-pixel SP of the organic light emitting display apparatus 100 according to the present disclosure.

As shown in FIG. 4, the organic light emitting display apparatus 100 according to the disclosure includes the gate line GL, the data line DL, and the power line PL crossing each other for defining the sub-pixel SP. A switching thin film transistor Ts, a driving thin film transistor DT, a storage capacitor Cst, and a light emitting device D are disposed in the sub-pixel SP.

The switching thin film transistor Ts is connected to the gate line GL and the data line DL, and the driving thin film transistor Td and the storage capacitor Cst are connected between the switching thin film transistor Ts and the power line PL. The light emitting device D is connected to the driving thin film transistor Td.

In the organic light emitting display apparatus having this structure, when the switching thin film transistor Ts is turned on according to the gate signal applied to the gate line GL, the data signal applied to the data line DL is applied to the gate electrode of the driving thin film transistor Td and one electrode of the storage capacitor Cst through the switching thin film transistor Ts.

The driving thin film transistor Td is turned on according to the data signal applied to the gate electrode. As a result, the current proportional to the data signal is supplied to the organic light emitting device D from the power line PL through the driving thin film transistor Td and then the organic light emitting device D emits light with a luminance proportional to the current flowing through the driving thin film transistor Td.

At this time, the storage capacitor Cst is charged with the voltage proportional to the data signal to keep the voltage of the gate electrode of the driving thin film transistor Td constant for one frame.

In the figure, only two thin film transistors Td and Ts and one capacitor Cst are provided, but the present disclosure is not limited thereto. Three or more thin film transistors and two or more capacitors may be provided in the present disclosure.

Figure 5:
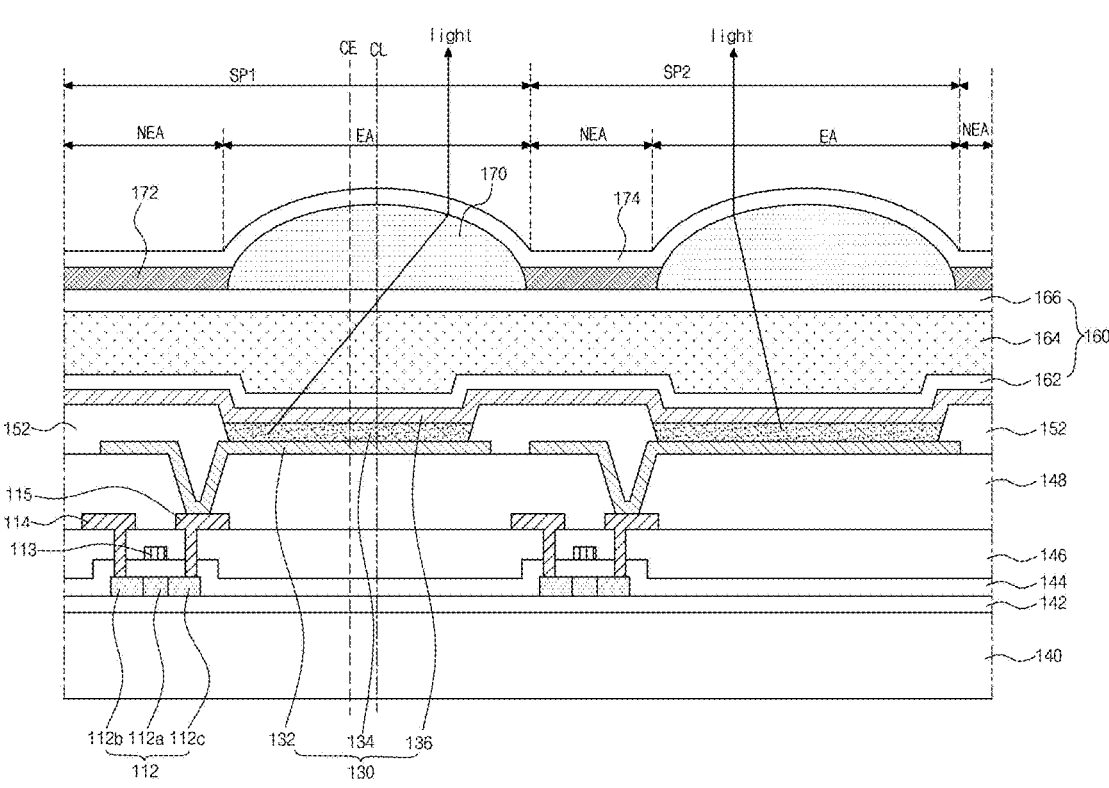
FIG. 5 is a cross-sectional view showing the structure of the display apparatus according to an embodiment of the disclosure.

FIG. 5 is a cross-sectional view showing the structure of the display apparatus 100 according to an embodiment of the disclosure.

As shown in FIG. 5, the display apparatus 100 of the disclosure includes a plurality of sub-pixels SP1 an SP2, and each of the sub-pixels SP1 and SP2 includes an emitting area EA and non-emitting area NEA. Each of the sub-pixels SP1 and SP2 may include Red (R) sub-pixel, Green (G) sub-pixel, and Blue (B) sub-pixel. Further, each of the sub-pixels SP1 and SP2 may further include White (W) sub-pixel.

A first buffer layer 142 is formed on a substrate 140. The substrate 140 may be made of a hard material such as a glass or a plastic material, but not limited thereto. For example, the plastic material may include a polyimide, a polymethylmethacrylate, a polyethylene tereththalate, a Polyethersulfone, and a Polycarbonate.

When the substrate 140 is made of polyimide, the substrate 140 may be made of a plurality of polyimide layers, and an inorganic layer may be further disposed between the polyimide layers, but is not limited thereto.

The buffer layer 142 may be formed in the entire area of the substrate 140 to enhance adhering force between the substrate 140 and the layers thereon. Further, the buffer layer 142 may block various types of defects, such as alkali components flowing out from the substrate 140. In addition, the buffer layer 142 may delay diffusion of moisture or oxygen penetrating the substrate 140.

The first buffer layer 142 may be a single layer made of silicon oxide ($SiO_x$) or silicon nitride ($SiN_x$), or multi-layers thereof. When the buffer layer 142 is made of multiple layers, $SiO_x$ and $SiN_x$ may be alternately formed. The buffer layer 142 may be omitted based on the type and material of the substrate 140, the structure and type of the thin film transistor, and the like.

A thin film transistor is formed on the buffer layer 142 in the display area AA. For convenience of description, only the driving thin film transistor among various thin film transistors that may be disposed in the display area AA is illustrated, but other thin film transistors such as switching thin film transistors may also be included. In the figure, the thin film transistor of a top gate structure is shown, but the thin film transistor is not limited to this structure and may be formed in other structures such as the thin film transistor of a bottom gate structure.

The thin film transistor includes a semiconductor pattern 112 disposed on the buffer layer 142, a gate insulating layer 144 covering the semiconductor pattern 112, a gate electrode 113 on the gate insulating layer 144, an interlayer insulating layer 146 covering the gate electrode 113, and a source electrode 114 and a drain electrode 115 on the interlayer insulating layer 146.

The semiconductor pattern 112 may be made of a polycrystalline semiconductor. For example, the polycrystalline semiconductor may be made of low temperature poly silicon (LTPS) having high mobility, but is not limited thereto.

The semiconductor pattern 112 may be made of an oxide semiconductor. For example, semiconductor pattern 112 may be made of one of IGZO (Indium-gallium-zinc-oxide), IZO (Indium-zinc-oxide), IGTO (Indium-gallium-tin-oxide), and IGO (Indium-gallium-oxide), but is not limited thereto. The semiconductor pattern 112 includes a channel region 112a in a central region and a source region 112b and a drain region 112c which are doped layers at both sides of the channel region 112a.

The gate insulating layer 144 may be formed in the display area AA and the non-display area NA or formed only in the display area AA. The gate insulating layer 144 may be composed of a single layer or multiple layers made of an inorganic material such as $SiO_x$ or $SiN_x$, but is not limited thereto.

The gate electrode 113 is made of a metal. For example, the gate electrode 113 may be formed of the single layer or multi layers made of one or alloys of molybdenum (Mo), aluminum (Al), chromium (Cr), gold (Au), titanium (Ti), nickel (Ni), neodymium (Nd), and copper (Cu), but is not limited thereto.

The interlayer insulating layer 146 may be formed in the display area AA and the non-display area NA or formed only in the display area AA. The interlayer insulating layer 146 may be made of the organic material such as photo-acryl, or the interlayer insulating layer 146 may formed of the single layer or the multiple layers made of the inorganic material such as $SiO_x$ or $SiN_x$, but is not limited thereto. Further, the interlayer insulating layer 146 may be formed of the multi layers of the organic material layer and the inorganic material layer, but is not limited thereto.

The source electrode 114 and the drain electrode 115 are formed of the single layer or multi layers made of one or alloys of molybdenum (Mo), aluminum (Al), chromium (Cr), gold (Au), titanium (Ti), nickel (Ni), neodymium (Nd), and copper (Cu), but is not limited thereto. The source electrode 114 and the drain electrode 115 may be respectively contacted to the source region 112b and the drain region 112c of the semiconductor through contact holes formed in the gate insulating layer 144 and the interlayer insulating layer 146.

Not shown in figure, a bottom shield metal layer may be disposed on the substrate 140 under the semiconductor pattern 112. The bottom shield metal layer minimizes a backchannel phenomenon caused by charges trapped in the substrate 140 to prevent afterimages or deterioration of transistor performance. The bottom shield metal layer may be composed of the single layer or the multi layers made of titanium (Ti), molybdenum (Mo), or an alloy thereof, but is not limited thereto.

A planarization layer 148 is formed on the substrate where the thin film transistor is disposed. The planarization layer 148 may be formed of the organic material such as photo acrylic. But it is not limited thereto. The planarization layer 148 may include a plurality of layers including the inorganic layer and the organic layer.

A light emitting device 130 is disposed on the planarization layer 148 in the emitting area EA of each of the sub-pixels SP1 and SP2. The light emitting device 130 includes a first electrode 132, an organic layer 134, and a second electrode 136.

The first electrode 132 is disposed on the planarization layer 148 and electrically connected to the drain electrode 115 of the thin film transistor through the contact hole formed in the planarization layer 148. The first electrode 132 may be formed of at least one of silver (Ag), aluminum (Al), gold (Au), molybdenum (Mo), tungsten (W), chromium (Cr), or an alloy thereof. The first electrode 132 is electrically connected to the drain electrode 115 of the thin film transistor to supply an image signal from the outside.

Further, the first electrode 132 may be formed of a transparent metal oxide layer such as indium tin oxide (ITO) or indium zinc oxide (IZO). In this case, the first electrode 132 may further include an opaque conductive material to function as a reflective electrode that reflects light.

A bank layer 152 is formed at the boundary between the R, G, and B sub-pixels on the planarization layer 148. The bank layer 152 may be a barrier wall to define R, G, and B sub-pixels.

The bank layer 152 is made of at least one material of the inorganic insulating material such as $SiN_x$ or $SiO_x$, the organic insulating material such as Benzo Cyclo Butene, acrylic resin, epoxy resin, phenolic resin, polyamide resin, or the photosensitizer including black pigment, but is not limited thereto.

The organic layer 134 is formed on the upper surface of the first electrode 132, the inclined surface of the bank layer 152, or the partial region of the upper surface of the bank layer 152. The organic layer 134 is formed in the R, G, and B sub pixels and may include an R-emitting layer for emitting red light, a G-emitting layer for emitting green light, and a B-emitting layer for emitting blue light. Further, the organic layer 134 may include a W-emitting layer for emitting white light. For example, the organic layer 134 may include an organic light emitting layer, an inorganic light emitting layer, a nano-sized material layer, a quantum dot layer, a micro LED light emitting layer, or a mini LED light emitting layer, but is not limited thereto.

The organic layer 134 may further include an electron injecting layer for injecting electrons into the light emitting layer, a hole injecting layer for injecting holes into the light emitting layer, an electron transporting layer for transporting the injected electrons to the light emitting layer, a hole transporting layer for transporting the injected holes to the light emitting layer, an electron blocking layer, and a hole blocking layer, but is not limited thereto.

The second electrode 136 is disposed on the organic layer 134 and may be formed of the half-transparent conductive material. For example, the second electrode 136 may be made of at least one or more of alloys such as LiF/Al, CsF/Al, Mg:Ag, Ca/Ag, Ca:Ag, LiF/Mg:Ag, LiF/Ca/Ag, LiF/Ca:Ag. Further, the second electrode 136 may be made of the transparent metal oxide material such as ITO or IZO, but is not limited thereto. The second electrode 136 may be formed in the entire area of the plurality of sub-pixels SP1 and SP2.

Further, the organic light emitting device D may be formed in a tandem structure. The tandem structure may include a plurality of organic light emitting layers and a charge generating layer disposed between the organic light emitting layers. The charge generating layer is disposed to adjust the charge balance between the plurality of organic light emitting layers, and may be formed of a plurality of layers including a first charge generating layer and a second charge generating layer. The charge generating layer may include an N-type charge generating layer and a P-type charge generating layer. In this case, the charge generating layer may be formed of the organic layer doped with an alkali metal such as Li, Na, K, or Cs or an alkaline earth metal such as Mg, Sr, Ba, or Ra, but is not limited thereto.

An encapsulating layer 160 is formed on the light emitting device 130. When the light emitting device 130 is exposed to impurities such as moisture or oxygen, a pixel shrinkage phenomenon in which the light emitting area is reduced or the defect such as a dark spot in the light emitting area may occur. Further, moisture or oxygen penetrating the light emitting device 130 oxidizes the metal electrode. The encapsulating layer 160 blocks impurities such as the oxygen and the moisture from the outside to prevent defects of the light emitting device 130 and various electrodes.

The encapsulating layer 160 may be formed of a first encapsulating layer 162, a second encapsulating layer 164, and a third encapsulating layer 166, but is not limited thereto. The encapsulating layer 160 may be formed of two layers having organic layer and inorganic layer or four or more layers having organic layers and inorganic layers.

The first encapsulating layer 162 and the third encapsulating layer 166 may be made of the inorganic material such as $SiO_x$ or $SiN_x$, but are not limited thereto.

The second encapsulating layer 164 may be made of the organic insulating material such as acrylic resin, epoxy resin, polyimide, polyethylene, or silicon oxycarbon (SiOC), but is not limited thereto.

A lens 170 is disposed on the encapsulating layer 160 in the light emitting area and a light shielding layer 172 is disposed on the encapsulating layer 160 between the lens 170. A passivation layer 174 may be formed over the lens 170 and the light shielding layer 172.

The lens 170 is disposed on the encapsulating layer 160 in figure. When the display apparatus 100 is the bottom emission type display apparatus 100, however, the lens 170 may be disposed under the light emitting device 130 and the lens 170 may be disposed on the lower surface of the substrate 140.

The lenses 170 are formed for each light emitting area EA of the sub-pixels SP1 and SP2 and are spaced apart from each other by the predetermined distance (for example, the distance between the non-light emitting areas NEA). The lens 170 may be a convex lens that is convex along an upward direction through which light is output. When the display apparatus 100 is a bottom emission type display apparatus 100, the lens 170 may be a convex lens that is convex along the downward direction.

The lens 170 disposed in each of the plurality of light emitting areas EA refracts and outputs the light emitted from the light emitting element 130 of the corresponding sub-pixels SP1 and SP2. Thus, a plurality of lens (e.g., convex lens) 170 may be disposed on the plurality of sub-pixels SP. In this case, since the light passing through the lens 170 is refracted in the front direction, the luminance of the display apparatus 100 is improved by the lens 170.

The lens 170 may be made of a light-transmitting polymer resin. For example, the lens 170 may be made of at least one selected from acrylic resin, polyimide, polyamide, polycarbonate, polystyrene, and polyethylene terephthalate, but is not limited thereto.

The light shielding layer 172 absorbs light. Specifically, the light shielding layer 172 blocks or absorbs light that is emitted from the first sub-pixel SP1 and output to the second sub-pixel SP2, so that the color of the first sub-pixel SP1 and the color of the second sub-pixel SP1 are not mixed. The light shielding layer 172 may be made of black resin and may be made of a metal-based material such as Cr or CrOx, but is not limited thereto.

The passivation layer 174 may include at least one layer made of the organic material or the inorganic material, or may include a plurality of layers having the inorganic layer and the organic layer, but is not limited thereto.

The lens 170 is aligned with the light emitting device 130. In particular, the lens 170 is aligned with the organic layer 134 through which light is actually emitted. At this time, in the disclosure, the center CL of the lens 170 and the center CE of the light emitting device 130 do not match and are spaced apart from each other by the predetermined distance L. Therefore, a lens 170 may be disposed such that the lens 170 overlaps at least a portion of the light emitting device 130 in a first direction (e.g., along x axis), but in one embodiment, the lens 170 may overlap an entire area of the light emitting device 130 in the first direction. A center of the lens 170 in a second direction (e.g., along y axis) is offset from a center of the light emitting device 130 (e.g., LED) in the second direction. For example, the center of the lens 170 along the second direction may be a center point or axis from one end of the lens 170 to another end of the lens 170 in the second direction. For example, a shape of the light emitting device 130 may correspond to a region where the first electrode 132, the organic layer 134, and the second electrode 136 overlap, and a center of the light emitting device 130 along the second direction may be a center point or axis from one end of the light emitting device 130 to another end of the light emitting device 130 along the second direction.

In the disclosure, by separating the center CL of the lens 170 and the center CE of the light emitting device 130 by the predetermined distance L, the luminance is increased in a specific viewing direction rather than in the front viewing direction.

When the display apparatus 100 of the disclosure is installed to the dashboard of the vehicle, for example, since the display apparatus 100 is disposed at a position lower than the driver's view, light input from the display apparatus 100 to the driver's eyes is output with the predetermined angle from the horizontal direction to the upper direction.

In the general display apparatus, the luminance is increased or maximized in the front viewing direction and the luminance is decreased significantly as the viewing direction moves up/down or left/right. Thus, when the general display apparatus is installed in the vehicle, the luminance of the light reached to the driver's eyes is decreased significantly so that the visibility of the driver looking at the dashboard is reduced.

In the disclosure, the center CE of the light emitting device 130 and the center CL of the lens 170 are separated by the predetermined distance along the viewing direction to improve luminance in the corresponding viewing direction having the predetermined angle with the front. Further, in the disclosure, the luminance in the specific viewing direction is further improved by varying the area of the light emitting device 130, more precisely the area of the light emitting region, according to the viewing direction. Hereinafter, this will be described in detail.

Figure 6:
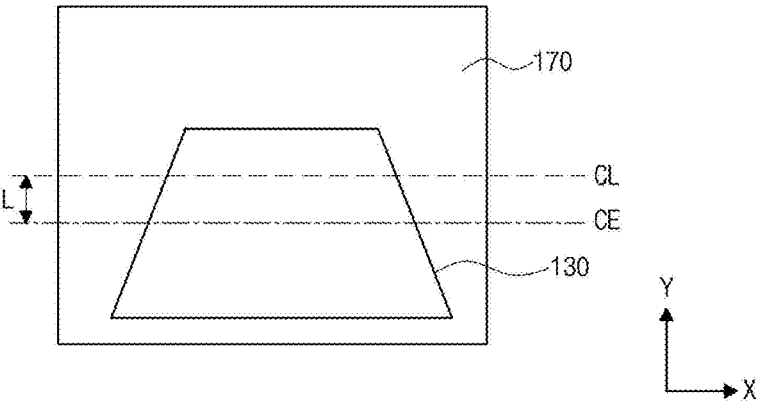
FIG. 6 is a plan view showing the arrangement relationship between light emitting device and lens of the display apparatus according to an embodiment of the disclosure.

FIG. 6 is a plan view showing the arrangement relationship between the light emitting device 130 and the lens 170 of the display apparatus 100 according to the disclosure.

As shown in FIG. 6, the light emitting device 130 and the lens 170 are overlapped for each other in the sub-pixel. In this time, the center CE of the light emitting device 130 and the center CL of the lens 170 are spaced apart from each other in the predetermined distance, not matched. That is, the center CE of the light emitting device 130 may be spaced apart from the center CL of the lens 170 by the predetermined distance L along the −y direction. Further, the center CL of the lens 170 may be spaced apart from the center CE of the light emitting device 130 by the predetermined distance L along the +y direction.

Figure 7:
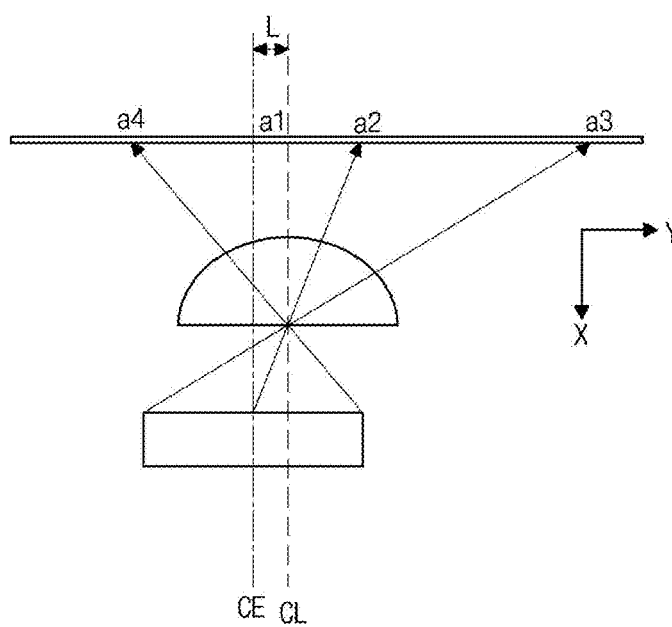
FIG. 7 is the view showing that light emitted from the light emitting device is output to a user through the lens.

FIG. 7 is the view showing the light output from the light emitting device 130 to the user through the lens 170 according to an embodiment of the present disclosure. In the figure, position a1 is the position corresponding to the center CE of the light emitting device 130, a2 is the position where the light emitted from the center CE of the light emitting device 130 is output through the lens 170, a3 is the position where the light emitted from the lowermost end of the light emitting device 130 is output through the lens 170, and a4 is the position wherein the light emitted from the uppermost end of the light emitting device 130 is outputted through the lens 170.

As shown in FIG. 7, as the center CE of the light emitting device 130 is spaced apart from the center of the center CL of the lens 170 by the predetermined distance L along the −y direction, that is, the center CE of the light emitting device 130 is positioned lower than the center CL of the lens 170, the emission area of the light emitted from the light emitting device 130 moves upward from the center of the light emitting device 130. Therefore, since the light emitting area with the highest luminance also moves upward from the center of the light emitting device 130, the luminance in the upward direction from the horizontal of the display apparatus 100 is increased.

Further, as shown in FIG. 6, the light emitting device 130 is formed in a trapezoidal shape of which the lower end of the plane is wider than the upper end. For example, the region where the first electrode 132, the organic layer 134, and the second electrode 136 overlap and light is emitted, may have a trapezoidal shape. Therefore, the amount of light emitted from the lower end of the light emitting device 130 is greater than the amount of light emitted from the upper end thereof.

As shown in FIG. 7, the light emitted from the upper end of the light emitting device 130 passes toward the lower side of the center CE of the light emitting device 130 (i.e., the −y direction) through the lens 170, and the light emitted from the lower end of the light emitting device 130 passes toward the upper side of the center CE of the light emitting device 130 (i.e., the +y direction) through the lens 170. Since the amount of light emitted from the lower end of the trapezoidal light emitting device 130 is greater than that from the upper end of trapezoidal light emitting device 130, the amount of light emitted upward is relatively greater than that of the horizontal surface of the display apparatus 100. Accordingly, the luminance in the upward direction is further increased than in the horizontal plane of the display apparatus 100.

In other words, in one embodiment, a lower portion of the light emitting device 130 disposed on a lower side of the center of the light emitting device 130 may be larger than an area of an upper portion of the light emitting device 130 disposed on an upper side of the center of the light emitting device 130. In this manner, an amount of light emitted through an upper portion of the lens 170 for a sub-pixel disposed on an upper side of the center of the lens 170 is greater than an amount of light emitted through a lower portion of the lens 170 disposed on a lower side of the center of the lens 170.

In the disclosure, since the center CE of the light emitting device 130 and the center CL of the lens 170 are separated by the predetermined distance and the light emitting device 130 is formed in the shape with the wider area on one side (for example, trapezoid shape), it is possible to improve luminance in the upper viewing direction (+y viewing direction).

Further, since the shape of the light emitting device 130 is formed in a trapezoid shape, the light emitting area in the +x direction at the lower end is increased. Accordingly, the luminance in the +x direction above the horizontal plane of the display apparatus 100 is greater than the luminance in the +x direction below the horizontal plane. However, it is appreciated that in other embodiments, the light emitting device 130 may have any shape that allows a lower portion of the light emitting device 130 to emit a greater amount of light than an upper portion of the light emitting device 130, such that the light emitted through an upper portion of the lens 170 is greater than an amount of light emitted through a lower portion of the lens 170 for improved viewing of a user.

Figure 8A:
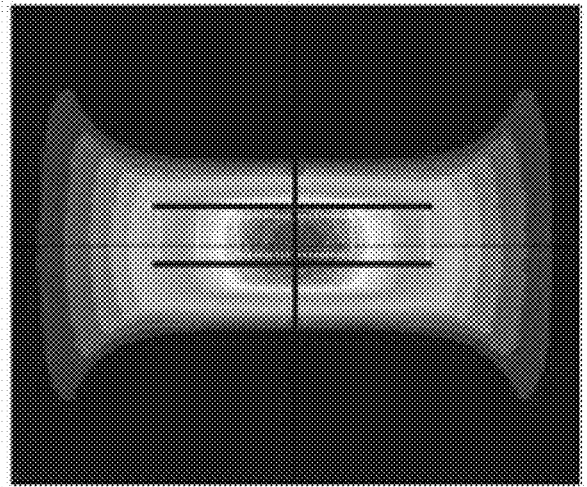
FIG. 8A is the diagram showing an optical profile of a prior display apparatus.
Figure 8B:
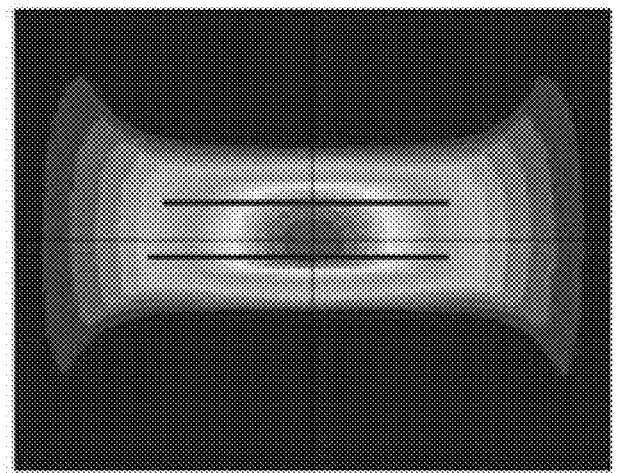
FIG. 8B is the view showing the optical profile of the display apparatus according to an embodiment of the disclosure in which the center of the light emitting device and the center of the lens are separated by the predetermined distance and the light emitting device has the rectangular shape.
Figure 8C:
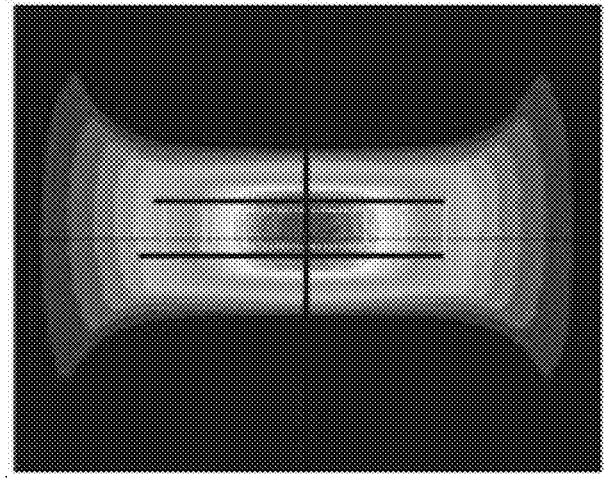
FIG. 8C is the view showing the optical profile according to an embodiment of the disclosure.

FIG. 8A is the view showing the optical profile of the prior display apparatus in which the center CE of the light emitting device 130 and the center CL of the lens 170 coincide and the light emitting device 130 has the rectangular shape. FIG. 8B is the view showing the optical profile in which the center CE of the light emitting device 130 and the center CL of the lens 170 are separated by the predetermined distance and the light emitting device 130 has the rectangular shape. FIG. 8C is the view showing the optical profile of the disclosure in which the center CE of the light emitting device 130 and the center CL of the lens 170 are separated by the predetermined distance and the light emitting device 130 has a trapezoid shape.

In the optical profile, two blue lines indicate vertical and horizontal viewing angles of 20° and −10°, respectively. When the display apparatus 100 of the disclosure is applied to the dashboard of the vehicle, the angle between the center of the display apparatus 100 and the driver's eyes is about 20°, although it varies depending on the driver's height and the height of the driver's seat. Therefore, in the disclosure, it is very important to improve luminance at a vertical and horizontal viewing angle of 20°.

Comparing FIGS. 8A and 8B, there is almost no luminance difference at a viewing angle of −10 degrees. However, at the viewing angle of +20 degrees, the luminance when the center CE of the light emitting device 130 and the center CL of the lens 170 are separated by the predetermined distance L is much greater than the luminance when the center CE of the light emitting device 130 and the center CL of the lens 170 coincide.

Comparing FIGS. 8B and 8C, when the light emitting device 130 is formed in the trapezoid shape, the luminance in the left-right viewing direction is also improved at the upper outer portion, that is, at the viewing angle of +20°.

Therefore, comparing FIGS. 8A and 8C, the luminance of the upper and lower viewing angles of +20° is greatly increased and the luminance of the left and right viewing directions in the viewing angle of +20° is also greatly increased, compared to the prior display apparatus in which the center CE of the light emitting device 130 and the center CL of the lens 170 coincide and the light emitting device 130 has the rectangular shape.

Figure 9:
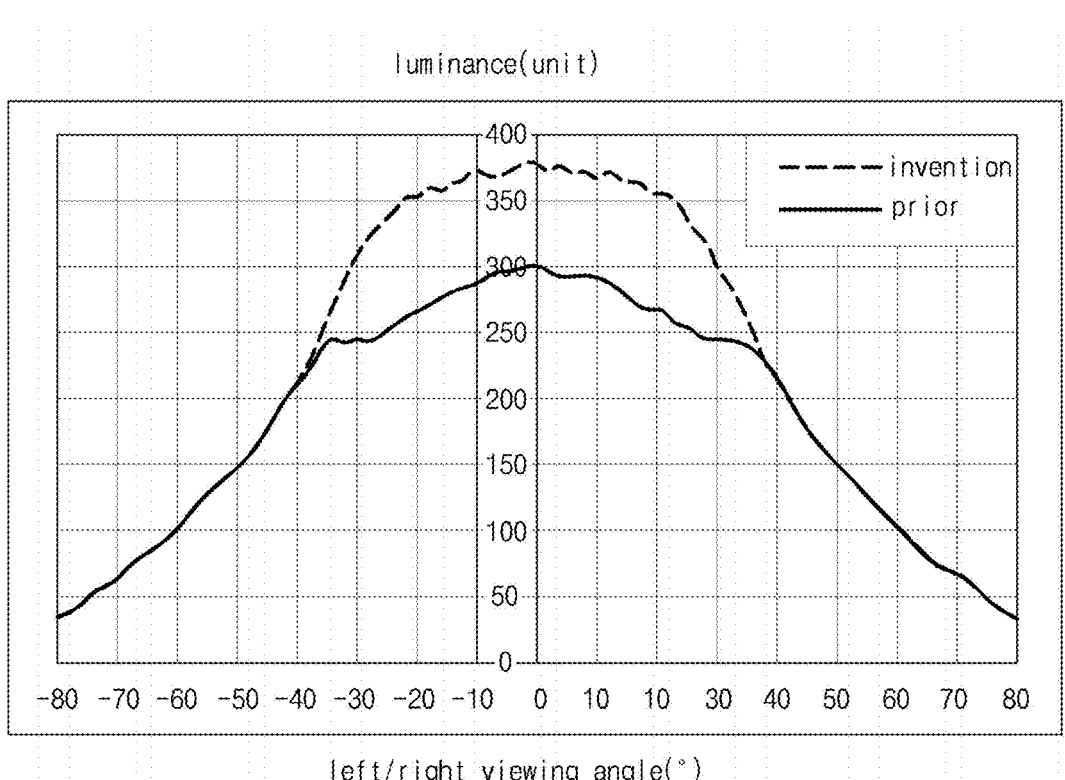
FIG. 9 is the view showing the luminance of the left and right viewing angle at the upper and lower viewing angle of +20° in the display apparatus according to an embodiment of the disclosure and the prior display apparatus.

FIG. 9 is the view showing the luminance of the left and right viewing angle at the upper and lower viewing angle of +20° in the display apparatus 100 of the disclosure and the prior display apparatus in which the center CE of the light emitting device 130 and the center CL of the lens 170 coincide and the light emitting device 130 has the rectangular shape. In this case, the x-axis is the left and right viewing angle direction, and the y-axis is the luminance.

As shown in FIG. 9, the luminance is about 290 nit at the left and right viewing angle of 0° in the prior display apparatus, whereas the luminance is improved to about 370 nit at the left and right viewing angle of 0° in the disclosure. Further, the luminance of the display apparatus of the disclosure is greatly improved compared to the prior display apparatus at the left and right viewing angle of about ±38°.

Figure 10:
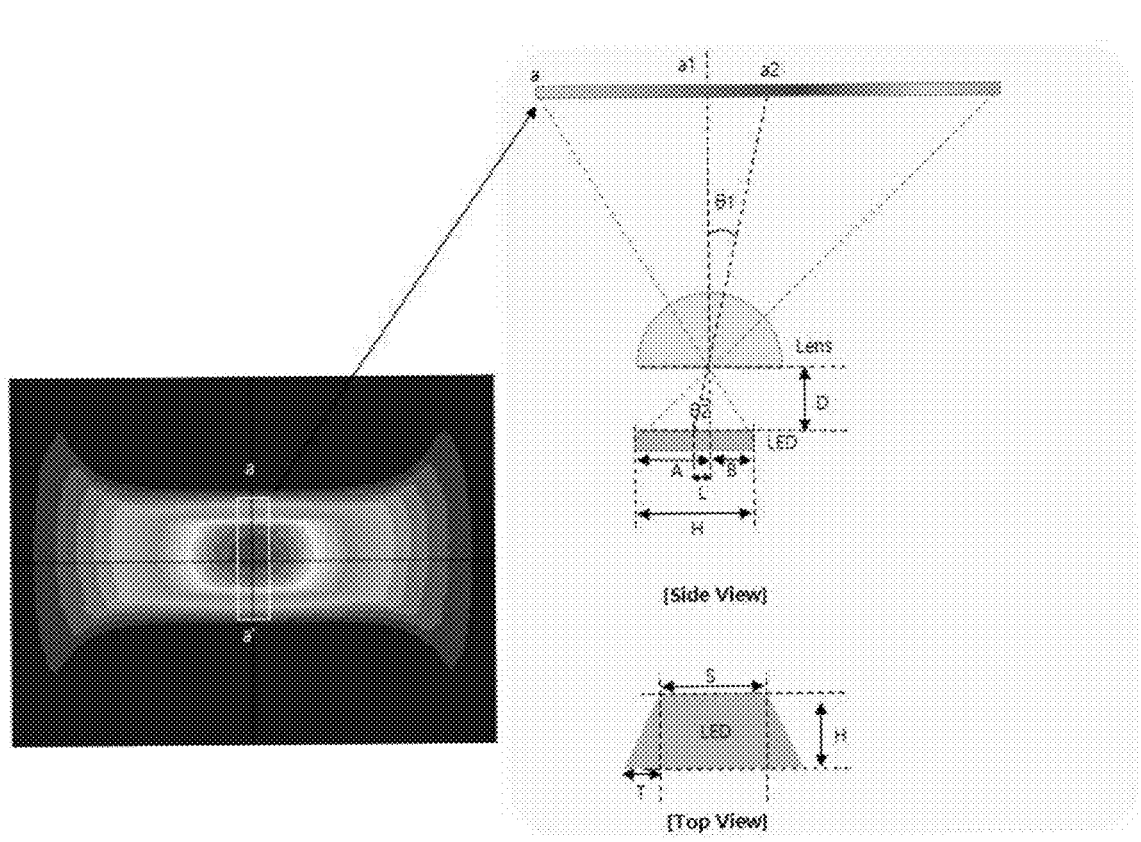
FIG. 10 is the view showing a side view and a front view of the display apparatus according to an embodiment of the disclosure.

FIG. 10 is a side view and a front view of the display apparatus 100 according to the disclosure. Hereinafter, the separation distance L between the center CE of the light emitting device 130 and the center CL of the lens 170 and the shape of the trapezoid light emitting device 130 will be described in detail with reference to FIG. 10.

In FIG. 10, $\theta 1$ is the emission angle of light from the center CL of the lens 170 to the desired area a2, for example, the area where the driver's eyes are located in the vehicle, and $\theta 2$ is the incident angle of the light from the center CE of the light emitting device to the center CL of the lens 170. D is the distance between the light emitting device 130 and the lens 170.

The distance D between the light emitting device 130 and the lens 170 may be derived as in equation 1 below.

$$M = \frac{\theta_1}{\theta_2},$$ [equation 1]

$$\theta_2 = \frac{\theta_1}{M}$$

$$L = D \times \tan\theta_2$$

$$L = D \times \tan\frac{\theta_1}{M}$$

In equation 1, M is the magnification of the lens. The magnification M is determined by the emission angle $\theta 1$ of the desired area a2 from the center CL of the lens 170 and the incident angle $\theta 2$ of the center CL of the lens 170 from the center CE of the light emitting device 130.

For example, when the distance D between the light emitting device 130 and the lens 170 is 25.8 μm and the emission angle $\theta 1$ of the desired area a1 from the center CL of the lens 170 is 2° (D=25.8 μm, $\theta 1$=2°), $\theta 1$/M is 1.3° and L=25.8 μm×tan 1.3°=0.6 μm. Therefore, if the light emitting device 130 and the lens 170 are disposed within the display apparatus 100 such that the distance L between the center CE of the light emitting device 130 and the center CL of the lens 170 is 0.6 μm, it is possible to improve the luminance in the upper viewing direction.

Further, when the length of the upper side of the trapezoid light emitting device 130 is S, the length of the lower side is (S+2T), and the height is H, the length T extending from the upper side is expressed by equation 2 below.

$$T = \frac{S}{2} \times \left(\frac{A}{B} - 1\right)$$ [equation 2]

Here, A and B are the lengths of the light emitting device 130 in the −y direction and +y direction from the center of the lens 170, respectively, and can be obtained from equation 1 (A=(H/2)+1, B=(H/2)−1, where H is the height of the trapezoid light emitting device 130).

When the length of the upper side (S) of the trapezoidal light emitting device 130 is 20 μm and the height (H) is 12 μm (S=20 μm, H=12 μm), A=(12/2)+0.6=6.6 μm and B=(12/2)−0.6=5.4 μm, so that T=20/2×(6.6/5.4−1)=2.2 μm.

As described above, in the disclosure, the distance L between the center CE of the light emitting device 130 and the center CL of the lens 170 and the shape of the trapezoid light emitting device 130 may be determined by the various factors such as the location of the user's eyes, the magnification of the lens 170, the length of the upper side and the height of the light emitting device 130, the distance between the light emitting device 130 and the lens 170.

In the above description, the light emitting device 130 is formed asymmetrically in the trapezoid shape. However, the light emitting device 130 of the disclosure is not limited to the trapezoid shape. In the disclosure, in order to improve luminance in the upper and lower viewing direction, the light emitting device 130 is formed in the asymmetrical shape so that the light emitting area of the specific region is larger than that of another region. Therefore, if the light emitting area can be formed in different asymmetrical shapes, the light emitting device 130 can be formed in various shapes.

Further, in the above description, the organic light emitting display apparatus is described as an example, but the disclosure is not applied only to such the specific display apparatus, but is applied to the various display apparatus such as a liquid crystal display apparatus, a quantum dot display apparatus, a mini LED display apparatus, a micro LED display apparatus, and the like.

Further, the display apparatus of the disclosure is not only applied to the dashboard of the vehicle, but can be used for various purposes. In particular, in the disclosure, when the main viewing direction has the certain angle rather than the front, the center of the light emitting device and the lens are spaced apart at the predetermined distance according to the main viewing direction and the shape of the light emitting device is formed asymmetrically, so that the luminance in the main viewing direction may be improved.

The above description and the accompanying drawings are merely illustrative of the technical spirit of the present disclosure, and those of ordinary skill in the art to which the present disclosure pertains can combine configurations within a range that does not depart from the essential characteristics of the present disclosure, various modifications or variations such as separation, substitution and alteration will be possible. Therefore, the embodiments disclosed in the present disclosure are not intended to limit the technical spirit of the present disclosure, but to explain, and the scope of the technical spirit of the present disclosure is not limited by these embodiments.

What is claimed is:

1. A display apparatus comprising:
   a substrate including a first region and a second region;
   a display device for displaying an image in the first region; and
   a lens above the display device in the first region,
   wherein a center of the display device and a center of the lens are spaced apart from each other by a predetermined distance, and
   wherein the display device is formed in an asymmetrical shape with respect to the center of the display device in a plan view, so that light output areas of the display device are different with respect to the center of the display device.

2. The display apparatus of claim 1, further comprising a light shielding layer in the second region.

3. The display apparatus of claim 2, further comprising a passivation over the lens and the light shielding layer.

4. The display apparatus of claim 1, wherein the lens includes a convex lens.

5. The display apparatus of claim 1, wherein the lens is made of at least one material selected from a group consisting of acrylic resin, polyimide, polyamide, polycarbonate, polystyrene, and polyethylene terephthalate.

6. The display apparatus of claim 1, wherein the distance between the center of the display device and the center of the lens is dependent upon at least one of an emission angle from the center of the lens, a magnification of the lens, a distance between the display device and the lens, an incident angle of the center of the lens from the center of the display device.

7. The display apparatus of claim 1, wherein the display device has a trapezoid shape.

8. The display apparatus of claim 7, wherein the trapezoid shape includes a first side, a second side longer than the first side, and a third side between the first side and the second side, and
   wherein a length of the second side is dependent on the lengths of the first side and the third side, a distance between the display device and the lens, a magnification of the lens, and an incident angle of the center of the lens from the center of the display device.

9. The display apparatus of claim 1, further comprising an encapsulating layer between the display device and the lens.

10. The display apparatus of claim 9, wherein the lens is disposed on the encapsulating layer.

11. The display apparatus of claim 1, wherein the display device includes an organic light emitting display device, a liquid crystal display device, a quantum dot display device, a micro LED display device, or a mini LED display device.

12. A display apparatus comprising:
    a substrate;
    a plurality of sub-pixels on the substrate, a sub-pixel including a light emitting device for displaying light and a transistor for driving the light emitting device;
    a plurality of convex lens on the plurality of sub-pixels,
    wherein a convex lens is disposed such that the convex lens overlaps at least a portion of the light emitting device in a first direction, and at least a portion of the displayed light is emitted toward first direction, and
    wherein a center of the convex lens in a second direction intersecting the first direction is offset from a center of the light emitting device in the second direction, and
    wherein the light emitting device is formed in an asymmetrical shape with respect to the center of the light emitting device in a plan view perpendicular to the first direction, so that light output areas of the light emitting device are different with respect to the center of the light emitting device.

13. The display apparatus of claim 12, wherein an area of a lower portion of the light emitting device disposed on a lower side of the center of the light emitting device is larger than an area of an upper portion of the light emitting device disposed on an upper side of the center of the light emitting device.

14. The display apparatus of claim 13, wherein the light emitting device has a trapezoid shape.

15. The display apparatus of claim 13, wherein an amount of light emitted through an upper portion of the convex lens disposed on an upper side of the center of the convex lens is greater than an amount of light emitted through a lower portion of the convex lens disposed on a lower side of the center of the convex lens.

16. The display apparatus of claim 12, wherein the convex lens cover an entire area of the light emitting device.

17. The display apparatus of claim 12, wherein a distance of the offset between the center of the convex lens and the center of the light emitting device depends on at least one of a distance between the convex lens and the light emitting device in the first direction, a first angle between the center of the convex lens and a viewing point, and a second angle between the center of the convex lens and the center of the light emitting device.

18. The display apparatus of claim 12, wherein a material of the convex lens includes at least one or a combination of acrylic resin, polyimide, polyamide, polycarbonate, polystyrene, and polyethylene terephthalate.

19. The display apparatus of claim 12, wherein the light emitting device is an organic light emitting display device, a liquid crystal display device, a quantum dot display device, a micro-light emitting diode (LED) device, or a mini LED device.

* * * * *